US006756246B2

(12) United States Patent
Hiramatsu et al.

(10) Patent No.: US 6,756,246 B2
(45) Date of Patent: Jun. 29, 2004

(54) METHOD FOR FABRICATING III-V GROUP COMPOUND SEMICONDUCTOR

(75) Inventors: Kazumasa Hiramatsu, Yakkaichi (JP); Hideto Miyake, Hisai (JP); Shinya Bohyama, Mie (JP); Takayoshi Maeda, Nabari (JP); Yasushi Iyechika, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/105,238

(22) Filed: Mar. 26, 2002

(65) Prior Publication Data

US 2003/0045017 A1 Mar. 6, 2003

(30) Foreign Application Priority Data

Sep. 6, 2001 (JP) ....................................... 2001-270091

(51) Int. Cl.[7] ........................ H01L 21/302; H01L 21/00

(52) U.S. Cl. ............................ 438/47; 438/22; 438/39; 438/462

(58) Field of Search .......................... 438/785, 46, 317, 438/331, 338, 363, 22, 39, 462, 469, 128, 706

(56) References Cited

U.S. PATENT DOCUMENTS 6,348,096 B1 * 2/2002 Sunakawa et al. ............ 117/88

OTHER PUBLICATIONS

Ohring, M. Materials Science of Thin Films, Academic, 2002, pp. 452–453, 457–471, 478–482.*

Usui et al., Jpn. J. Appl. Phys, vol. 36, Part 2. No. 7B, pp. 899–902 (1997).

Kashima et al., Jpn. J. Appl. Phys., vol. 38, Part 2, No. 12B, pp. L1515–L1518 (1999).

Ishibashi et al., Journal of Crystal Growth, vol. 22, pp. 338–344 (2000).

Ishida et al., Journal of Crystal Growth, vol. 22, pp. 345–349 (2000).

Tanaka et al., Jpn. J. Appl. Phys., vol. 39, Part 2, No. 8B, pp. 831–834 (2000).

Zheleva et al. MRS Internet Journal, vol. 4S1, paper No. G3 38, 6 pages (1999).

Kashima et al., MRS Internet Journal, vol. 5S1, paper np. W2. 8, 6 pages.

* cited by examiner

*Primary Examiner*—Michael S. Lebentritt
(74) *Attorney, Agent, or Firm*—Birch, Stewart, Kolasch & Birch, LLP

(57) ABSTRACT

A method for fabricating a GaN-based III–V Group compound semiconductor is provided that utilizes a regrowth method based on the HVPE method to form a second III–V Group compound semiconductor layer having a flat surface on a first III–V Group compound semiconductor layer formed with a mask layer. The method uses a mixed carrier gas of hydrogen gas and nitrogen gas to control formation of a facet group including at least the {33–62} facet by the regrowth, and conducting the regrowth until a plane parallel to the surface of the first III–V Group compound semiconductor layer is once annihilated, thereby fabricating a III–V Group compound semiconductor having low dislocation density.

3 Claims, 10 Drawing Sheets

REGROWTH LAYER
BASE CRYSTAL
MASK
$\{11\bar{2}2\}$
78°
2μm
2μm
2μm
$\{1\bar{1}01\}$
$\{1\bar{1}01\}$
2μm
2μm
2μm
$\langle 1\bar{1}00\rangle$ STRIPE
$\langle 11\bar{2}0\rangle$ STRIPE
0
0.5
0.9
MIXING SHARE $H_2/(N_2+H_2)$ $N_2 + H_2$ CARRIER $N_2$ CARRIER

METHOD FOR FABRICATING III-V GROUP COMPOUND SEMICONDUCTOR

BACKGROUND OF THE INVENTION

1. Field of the Invention

This invention relates to a method for fabricating a gallium nitride (GaN)-based III–V Group compound semiconductor.

2. Background Art

GaN-based III–V Group compound semiconductors represented by the general formula InxGayAlzN (where x+y+z=1, $0 \leqq x \leqq 1$, $0 \leqq y \leqq 1$, $0 \leqq z \leqq 1$) can be adjusted in direct band gap energy by varying the III Group element content. As this makes them adaptable to optical energies of wavelengths from ultraviolet to red, they are usable as high-efficiency light-emitting element materials over a range extending from ultraviolet to visible light. Moreover, since they have a larger band gap than Si, GaAs and other such semiconductors widely used up to now, they can maintain the characteristics of a semiconductor up to high temperatures at which conventional semiconductors cannot operate. This property is basically utilizable to fabricate electronic devices with excellent environmental resistance.

Owing to the very high vapor pressure of GaN-based III–V Group compound semiconductors in the vicinity of the melting point, however, growth of a large crystal is extremely difficult and a crystal of a size practical for use as a substrate for fabricating semiconductor chips cannot be obtained. The general practice in fabricating compound semiconductors is therefore to use a substrate of sapphire, SiC or other material that has a crystal structure similar to the compound semiconductor and enables large crystal fabrication and to epitaxially grow a desired single crystal thin-film layer on the substrate. Relatively good quality crystals of these compound semiconductors have now become obtainable by using this method. Even when this method is used, however, reduction of crystal defects caused by differences in lattice constant and/or coefficient of thermal expansion between the substrate material and the compound semiconductor is difficult. Defect densities on the order of $10^8$ $cm^{-2}$ or greater are typical. This is a problem in light of the strong demand for bulk GaN substrates with low dislocation densities for fabrication of high-performance GaN-based devices.

Against this backdrop, a method has been reported for treating such a compound semiconductor having high crystal defect density to obtain a compound semiconductor with reduced defect density (Jpn. J. Appl. Phys., vol. 36, p L899, 1997). The reported method consists in covering the surface of the compound semiconductor having high defect density (hereinafter called the "base crystal") with a $SiO_2$ pattern including minute openings and then conducting crystal growth a second time on this surface to grow the desired compound semiconductor with few crystal defects. In the explanation that follows, the second and later crystal growths are referred to as "regrowths."

At the initial stage of regrowth by this method, selective growth proceeds in which crystal growth occurs only at the openings and not on the $SiO_2$ pattern. As crystal growth continues beyond this stage, the crystal grown at the openings also spreads over the $SiO_2$ pattern to eventually produce a structure that overgrows the $SiO_2$ pattern. Just after the $SiO_2$ pattern has been overgrown, the surface of the crystal formed by the regrowth includes irregularities and is not flat. With continued crystal growth, however, the irregularities of the regrown surface diminish and a flat crystal surface can be obtained in the end. It has been ascertained that the formation of such an overgrown structure enables the dislocation density at the regrown layer to be reduced markedly from that of the base crystal.

When reduction of dislocation density by epitaxial lateral overgrowth (ELO) is attempted, however, the mechanism of the defect reduction by the aforesaid regrowth differs depending on the growth method and/or growth conditions. Broadly viewed, the mechanism falls into the following two types. In the first type, as shown in FIG. 10, the regrown layer 101 inherits the threading dislocations 103 of the base layer 102. On the other hand, no dislocations occur in the regrown layer 101 above the pattern 104 because the dislocations of the base layer 102 are terminated by the pattern 104. In this case, however, reduction of dislocation is possible only in the regrown layer 101 above the pattern 104. In the regrown layer 101 above the openings 104A of the pattern 104, dislocations inherited from the base layer 102 thread into the regrown layer 101 so that substantially no reduction of dislocations can be expected in these regions.

In the second type, as shown in FIG. 11, dislocations are reduced owing to the formation of facets by the regrown layer 101 above the openings 104A of the pattern 104. The growth surfaces of the threading dislocations 103 inherited from the base layer 102 are bent by the facets of the regrown layer 101 so that the defect density decreases with increasing thickness of the grown film. While in the case of the second mechanism, differently from the first, the dislocation density above the openings 104A is low but the dislocations concentrate in the regions above the pattern 104. Thorough reduction of these dislocations requires growth of the regrown layer 101 to a considerable thickness of several tens of micrometers.

As the thickness of the compound semiconductor film including the regrown layer on the substrate increases, strain increases owing mainly to difference in coefficient of thermal expansion relative to the substrate. When the overall thickness of the compound semiconductor film reaches several tens of micrometers, this stress is liable to produce cracks and other defects in the substrate and/or the compound semiconductor. In some cases moreover, a large deformation may occur that makes the wafer radius of curvature smaller than 1 meter. Such a heavily deformed wafer causes various problems in the semiconductor fabrication process, such as that focusing becomes difficult during patterning in fine semiconductor processes.

SUMMARY OF THE INVENTION

One object of the present invention is therefore to provide a method for fabricating a III–V Group compound semiconductor that overcomes the foregoing problems of the prior art.

Another object of the present invention is to provide a method for fabricating a III–V Group compound semiconductor with low dislocation density.

Another object of the present invention is to provide a method utilizing epitaxial lateral overgrowth technology for fabricating a III–V Group compound semiconductor that has a III–V Group compound semiconductor of low dislocation density on a compound semiconductor of high defect density.

The present invention achieves these objects by providing a method for fabricating a III–V Group compound semiconductor comprising a step of preparing a base crystal containing a gallium nitride-based compound semiconductor, a step of forming a mask pattern on the base crystal, and a regrowth step of fabricating an overgrowth structure of a gallium nitride-based compound semiconductor having a flat surface on the base crystal formed with the mask pattern by a regrowth method, the regrowth step including a process of once annihilating a plane parallel to the base crystal by a facet group including at least a {33–62} facet.

The mask pattern is preferably a stripe pattern parallel to the <1–100> direction. In a preferred aspect of the invention, the regrowth utilizes the hydride vapor phase growth method, with mixed hydrogen gas and nitrogen gas being used as carrier gas. Parallel plane annihilation can be conducted by controlling the mixing ratio of the mixed carrier gas to control formation of the facet group. The AlN content of the base crystal is preferably not less than 1%.

This invention will be better understood and other objects and advantages thereof will be more apparent from the following detailed description of preferred embodiments with reference to the accompanying drawings.

DESCRIPTION OF THE PREFERRED EMBODIMENTS

Figure 1:
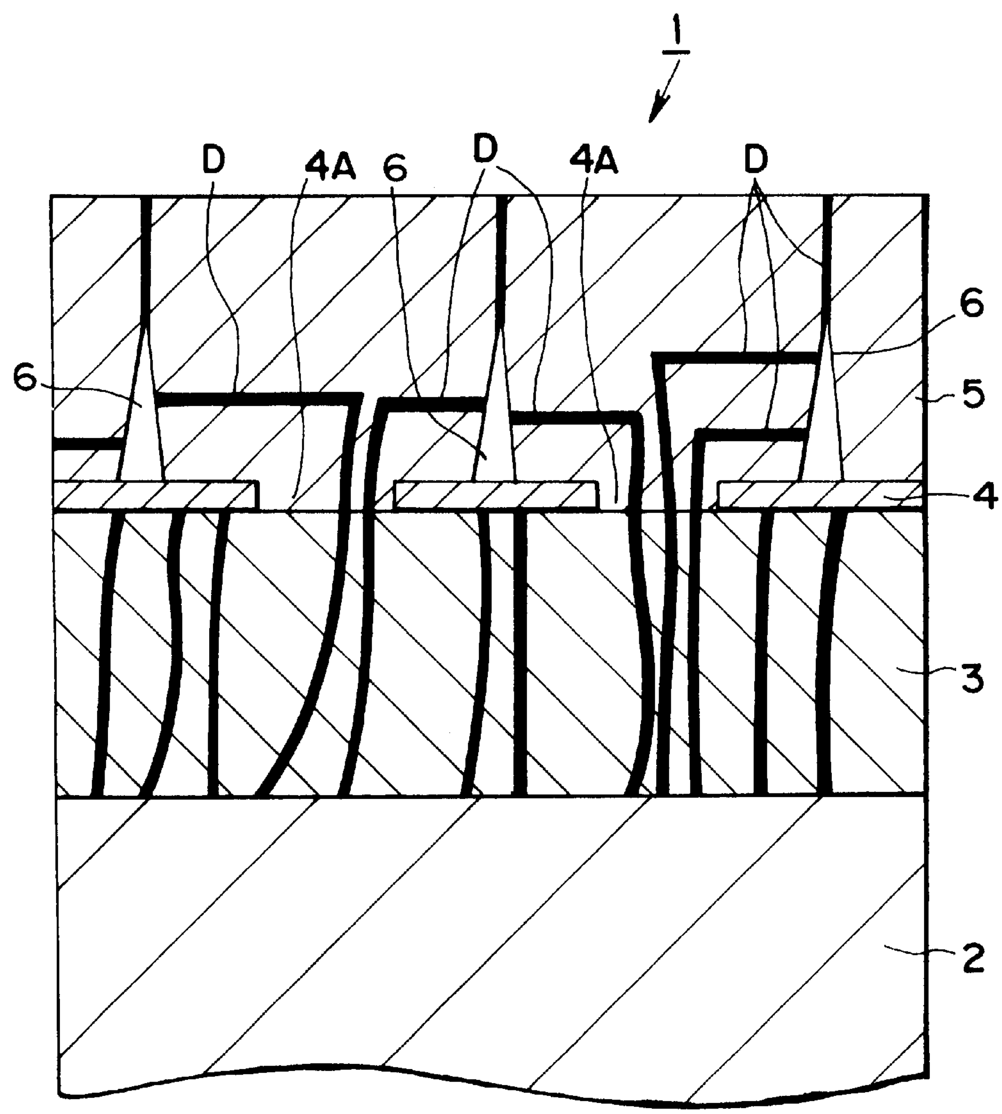
FIG. 1 is a schematic sectional view of showing the structure of a III–V Group compound semiconductor fabricated by the method of the present invention.

FIG. 1 is a schematic sectional view showing the structure of an example of a III–V Group compound semiconductor fabricated by the method of the present invention. A method of fabricating the III–V Group compound semiconductor 1 of FIG. 1 that is an embodiment of the present invention will be explained with reference to FIG. 2A to FIG. 2D.

Figure 2A:
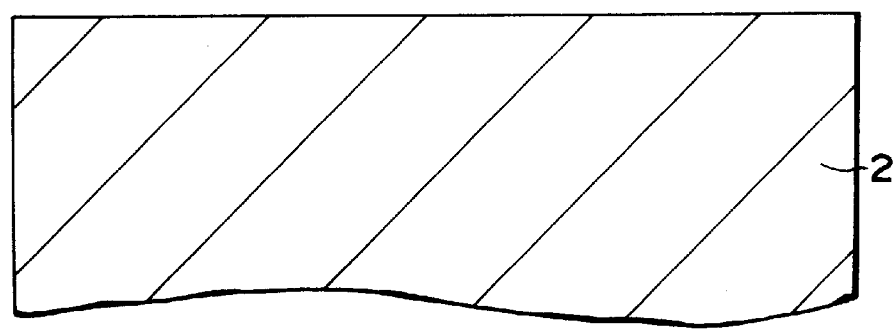
FIG. 2A to FIG. 2D are cross sectional views each showing the structure of the workpiece during a process of fabricating the compound semiconductor of FIG. 1.
Figure 2B:
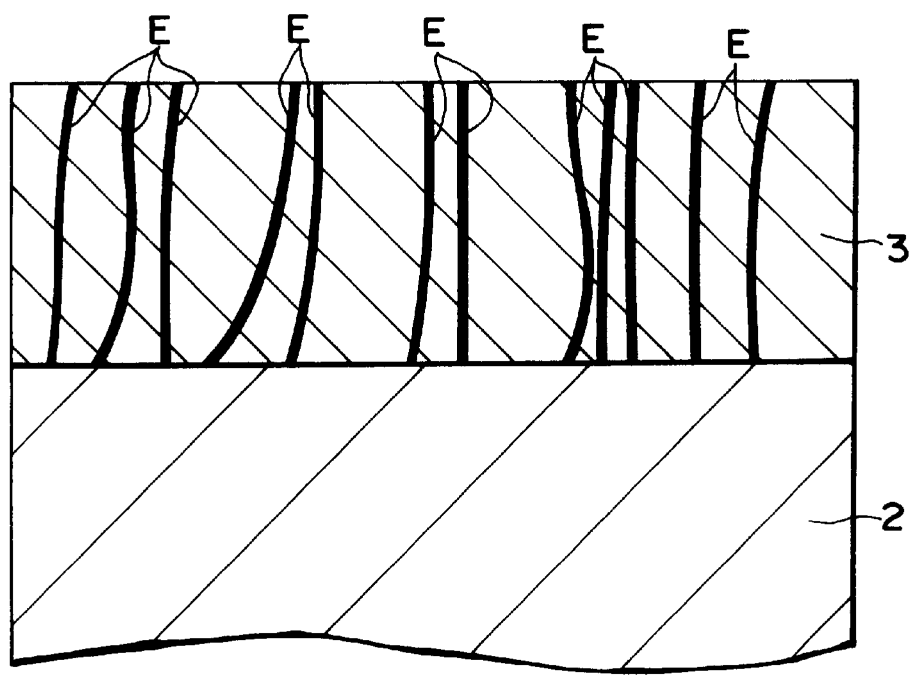

First, as shown in FIG. 2A, a sapphire substrate 2 is prepared. Next, as shown in FIG. 2B, a first III–V Group compound semiconductor layer 3 to serve as a base crystal is grown on the sapphire substrate 2 to a thickness of 3–5 $\mu$m by the metalorganic vapor phase epitaxial (MOVPE) method. The symbol E in the drawing designates dislocations occurring during growth of the first III–V Group compound semiconductor layer 3. The III–V Group compound semiconductor 1 is a GaN-based III–V Group compound semiconductor crystal layer represented by the general formula InuGavAlwN (where, $0 \leqq u \leqq 1$, $0 \leqq v \leqq 1$, $0 \leqq w \leqq 1$), u+v+w=1). The two-stage growth method using a known buffer layer of, for example, GaN, AlN, GaAlN or SiC, is, however, effective for obtaining a high quality base crystal.

Figure 2C:
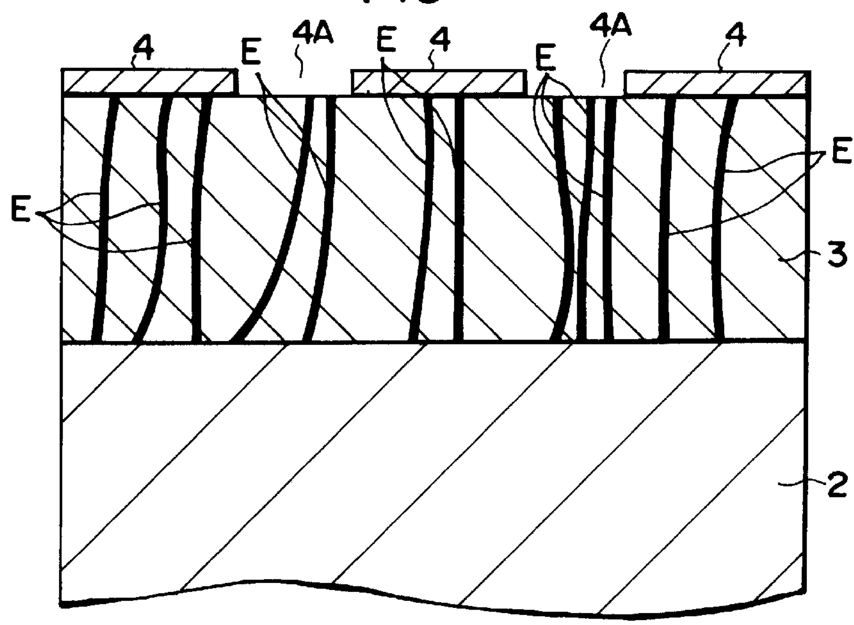

Next, as shown in FIG. 2C, a mask layer 4 is formed on the first III–V Group compound semiconductor layer 3 by patterning a $SiO_2$ layer deposited by the RF sputtering method.

After the mask layer 4 has been formed by depositing a layer of $SiO_2$ of appropriate thickness on the first III–V Group compound semiconductor layer 3, a plurality of windows 4A of slit-like shape are formed by photolithography. The windows 4A can, for instance, be formed in an approximately 5 $\mu$m width stripe pattern. The mask pattern is parallel to the <1–100> direction.

Figure 2D:
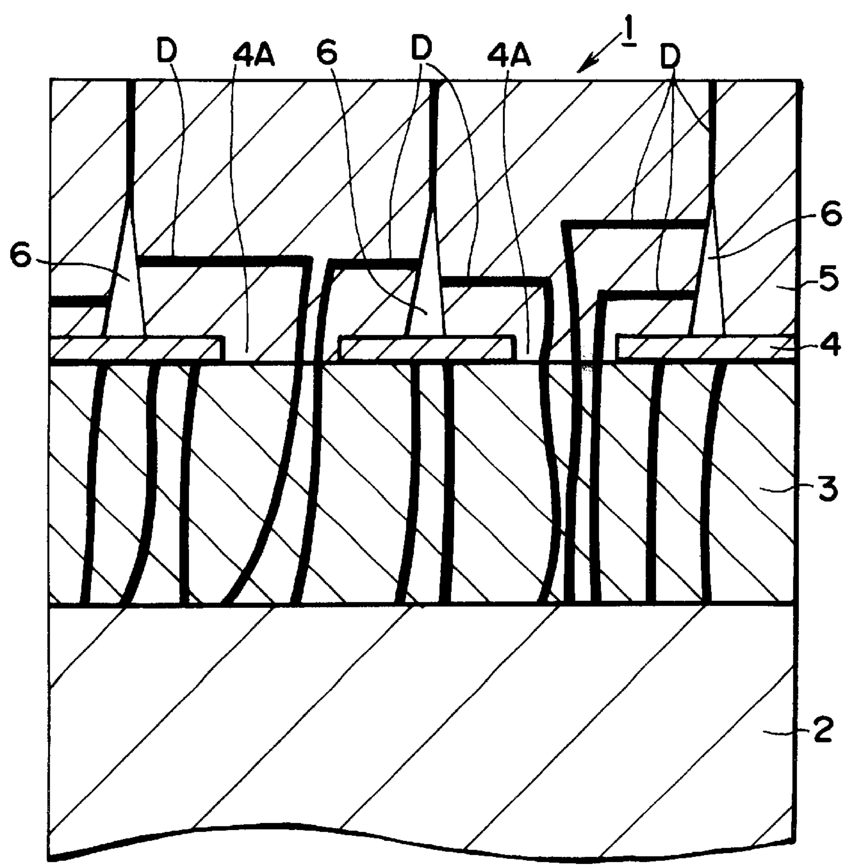

Further, as shown in FIG. 2D, a second III–V Group compound semiconductor layer 5 represented by the general formula InxGayAlzN (where $0 \leqq x \leqq 1$, $0 \leqq y \leqq 1$, $0 \leqq z \leqq 1$, x+y+z=1) is formed on the first III–V Group compound semiconductor layer 3 and the mask layer 4 by regrowth. The second III–V Group compound semiconductor layer 5 is formed by the hydride vapor phase epitaxial (HVPE) method. Among the many dislocations E occurring in the first III–V Group compound semiconductor layer 3 constituting the base crystal at this time, the threading dislocations D that pass through the windows 4A without being teminated by the mask layer 4 are inherited.

Methods that can be used to fabricate the III–V Group compound semiconductor 1 include the molecular beam epitaxy (MBE) method, the MOVPE method and the HVPE method. The MBE method plays an important role as a method suitable for fabricating a multilayer structure having a sharp interface. The MOVPE method is suitable for fabricating a multilayer structure having a sharp interface and also plays an important role in uniform film deposition over a wide area. The HVPE method plays an important role in the fabrication of low-impurity crystal at a high deposition rate.

When the HVPE method is used to grow the second III–V Group compound semiconductor layer 5, good-quality crystal can be obtained in a short time thanks to the high growth rate.

The following starting materials can be used to fabricate III–V Group compound semiconductor by the HVPE method.

As the III Group starting material can be used GaCl and InCl obtained by reacting metallic Ga and metallic In, or the like, with hydrogen chloride gas. Also usable are GaCl, InCl and the like produced by reacting high-temperature hydrogen chloride gas and, for example, a trialkyl gallium such as TMG or TEG represented by the general formula R1R2R3Ga (where R1, R2 and R3 are lower alkyl groups) or a trialkyl indium such as TMI or triethyl indium represented by the general formula R1R2R3In (where R1, R2 and R3 are lower alkyl groups). GaCl and InCl can also be produced by high-temperature decomposition of, for example, dimethyl gallium chloride ($Ga(CH_3)_2Cl$), diethyl gallium chloride (Ga $(C_2H_5)_2Cl$), dimethyl indium chloride (In $(CH_3)_2Cl$) and diethyl indium chloride (In $(C_2H_5)_2Cl$). Moreover, the carrier gas can be supplied by bubbling to, for example, $GaCl_3$ and $InCl_3$, which are stable at normal room temperature. These can be used singly or in mixtures.

As the III Group starting material can be used ammonia, hydrazine, methylhydrazine, 1,1-dimethylhydrazine, 1,2-dimethylhydrazine, t-butylamine, ethylenediamine and the like. These can be used singly or in mixtures. Among these starting materials ammonia and hydrazine, which contain no carbon atoms in their molecules, are preferable in that they minimize carbon contamination of the semiconductor. From the viewpoint of handling ease, ammonia is preferable.

In the HVPE method, the starting material carrier gas used can be selected from among rare gases like hydrogen and nitrogen. In this embodiment, a carrier gas obtained by mixing hydrogen gas and nitrogen gas is used.

When the second III–V Group compound semiconductor layer 5 grows, it forms a facet whose morphology controls the propagation of threading dislocations D, i.e., controls the epitaxial lateral overgrowth, in the second III–V Group compound semiconductor layer 5. As a result, the dislocation density in the second III–V Group compound semiconductor layer 5 can be reduced. Factors that conceivably control the facet during regrowth include the amounts of the starting materials supplied, growth temperature, growth pressure, partial pressure ratio (mixing ratio) of the carrier gas, and impurities. A series of experiments conducted with regard to these factors showed that epitaxial lateral overgrowth can be very well controlled by using the partial pressure ratio of the mixed carrier gas as the facet control factor. Under this control, the threading dislocations D grow laterally in the second III–V Group compound semiconductor layer 5, thereby helping to reduce the dislocation density at the surface of the second III–V Group compound semiconductor layer 5.

In the first step of regrowth, therefore, the direction of the threading dislocations D inherited from the first III–V Group compound semiconductor layer 3 constituting the base crystal is controlled by controlling the partial pressure ratio of the mixed carrier gas. The partial pressure ratio is set at a value suitable for bending the threading dislocations D in the direction of the interface with the base crystal. Specifically, regrowth by the HVPE method conducted using a mixed carrier gas of hydrogen gas and nitrogen gas is continued until the plane on the regrown crystal that lies parallel to the surface of the base crystal is annihilated by a facet group including at least the {33–62} facet. Ordinarily, the plane parallel to the surface of the base crystal is the (0001) plane. Under these growth conditions, a facet that inclines at an angle to the base crystal appears. After the plane on the regrown crystal that lies parallel to the surface of the base crystal has been annihilated, regrowth can be continued under the same conditions to continue growing only the inclined facet. The angle of the inclined facets can be controlled by the partial pressure ratio of the nitrogen gas and the hydrogen gas.

In the second step of this embodiment, gaps 6 are actively formed on the patterned portion in order to prevent propagation of the once directionally bent dislocations to the crystal surface. Thus, the dislocations terminate at the gap interfaces. Specifically, regrowth is continued with the growth conditions changed to conditions that give rise to a plane parallel to the surface of the first III–V Group compound semiconductor layer 3.

FIG. 2D shows an example in which the width of the gaps 6 narrows with regrowth and the regrown crystal surface ultimately becomes flat. When a device fabricated on the III–V Group compound semiconductor 1 has a small area equal to or smaller than the pattern, however, exposure of openings of the gaps 6 at the regrown crystal surface is permissible. For instance, the active layer of a semiconductor laser is about 3 $\mu$m wide and about 1 mm long. So long as the mask is striped and the mask spacing and length are not less than around 5 $\mu$m and 1 mm, respectively, the device can be fabricated while avoiding the openings of the gaps 6.

Figure 3:
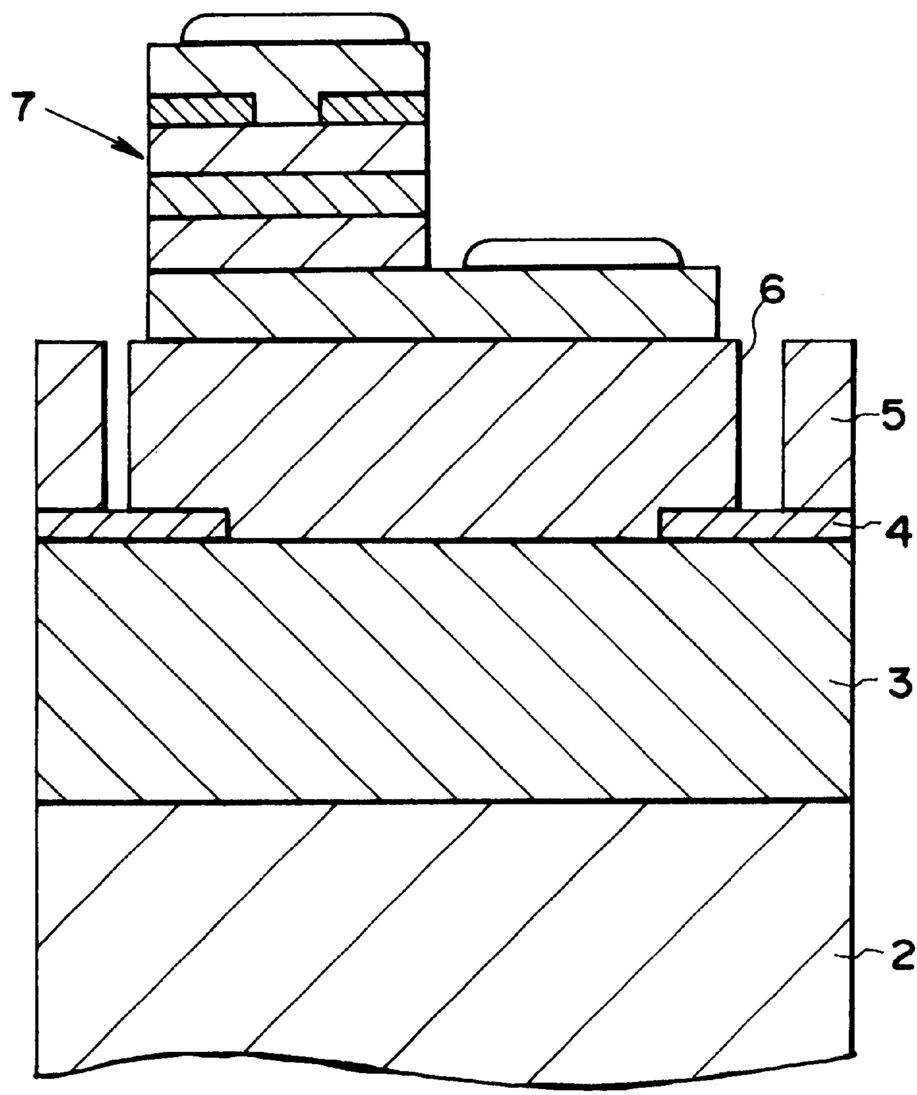
FIG. 3 is a diagram for explaining a configuration in the case of forming a device on the semiconductor shown in FIG. 1.

FIG. 3 is a rough overview of the configuration in this case. The reference numerals in FIG. 3 indicate portions corresponding to like numbered portions in FIG. 1. Reference numeral 7 indicates a device.

The example described above comprises two steps of regrowth where in the second step, gaps are formed above the center portion of the masks. It is also effective to continue the regrowth using the same growth condition as the first step of the regrowth until a flat surface which is parallel to the surface of the base crystal is obtained after bending the direction of the threading dislocation to the direction parallel to the surface of the base crystal. In this case, the gaps are not necessarily formed on the masks.

When the mask pattern is striped, stripe orientation in the <1–100> direction is preferable to stripe orientation in the <11–20> direction because it enables easier control of the facet shape by varying the growth conditions.

Even when a low defect crystal is fabricated in this manner, a small number of threading dislocations still tend to remain on the mask pattern. In such a case, defects on the pattern can be reduced by forming a mask on the surface of the regrown crystal and again conducting regrowth. The pattern used for conducting the second regrowth is formed to cover the regions where dislocations remain after the first regrowth. After the first regrowth, dislocations remain only in a limited region approximately at the pattern center. A relatively small pattern can therefore be used for the second regrowth. The fact that the pattern used for the second regrowth is reduced in size means that the region to be overgrown is smaller. It can therefore be overgrown at a smaller thickness than when overgrowing a large region. This is preferable from the points of reducing stress in the regrown layer on the second pattern, fluctuation in crystal orientation, substrate warp after regrowth, and the like.

In the foregoing it was explained that advantage can be taken of the facet growth occurring in the second III–V Group compound semiconductor layer 5, particularly of the fact that the facet inclination depends on the partial pressure ratio of the mixed carrier gas, to control the bend direction of threading dislocations in the second III–V Group compound semiconductor layer 5, and, by this, reduce the dislocation density in the second III–V Group compound semiconductor layer 5. By checking in advance how facet growth arising in the second III–V Group compound semiconductor layer 5 depends on the partial pressure ratio of the mixed carrier gas, therefore, it becomes possible to appropriately conduct semiconductor growth.

Figure 4:
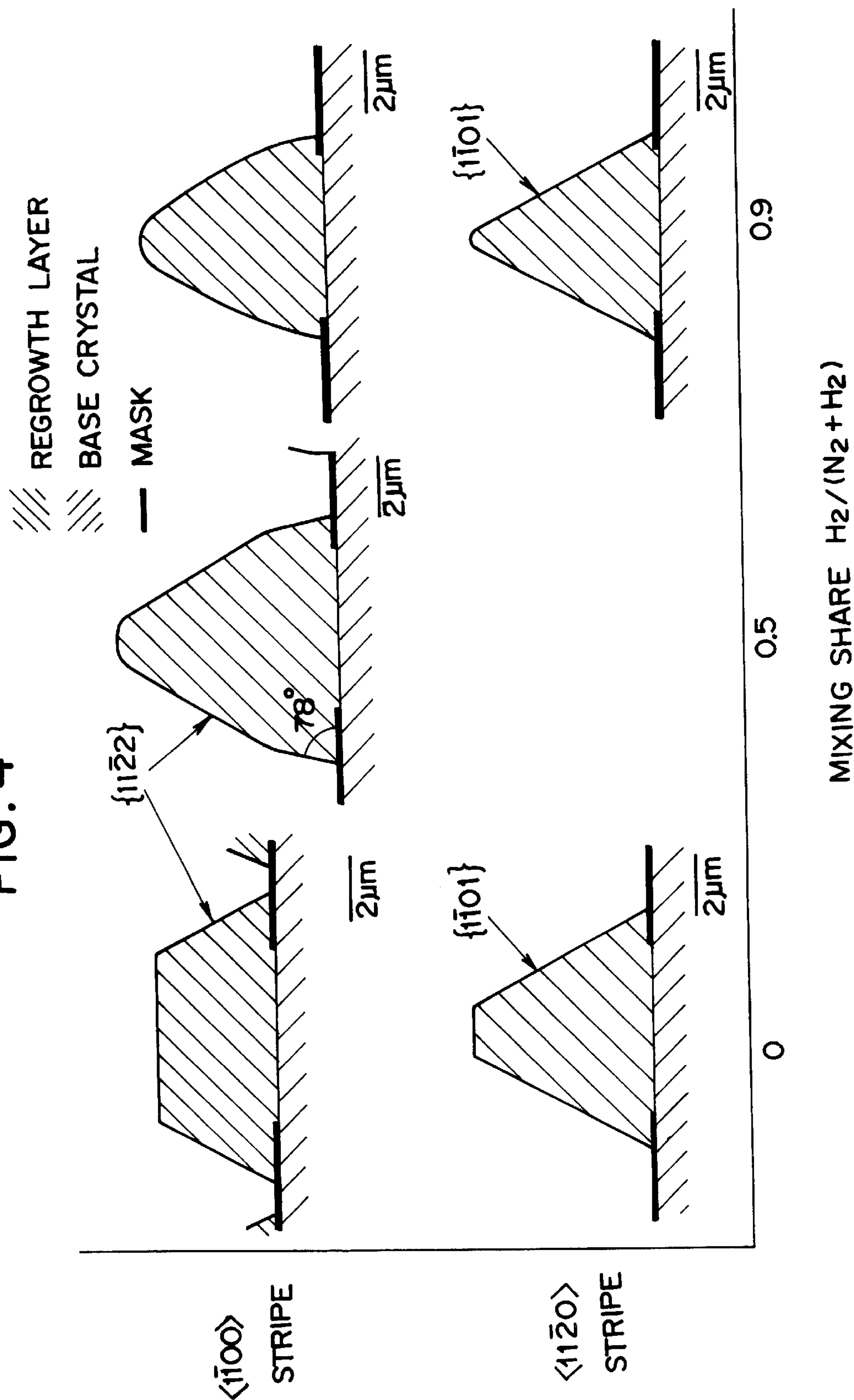
FIG. 4 is a set of views showing results obtained in an experiment for investigating the effect of carrier gas mixing ratio on epitaxial layer overgrowth.
Figure 5A:
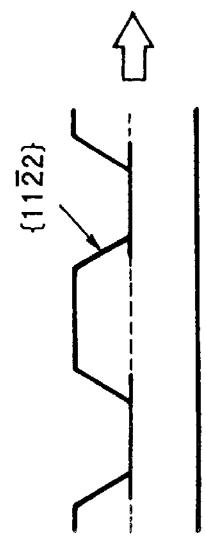
FIG. 5A to FIG. 5F are diagrams showing change in ELO shape when a III–V Group compound semiconductor layer is formed using a mixed carrier gas.
Figure 5B:
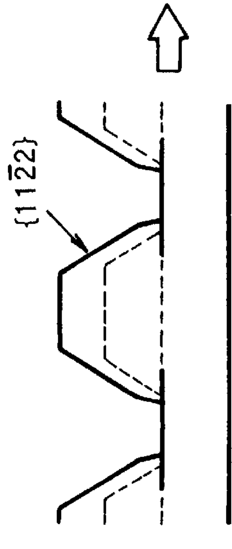
Figure 5C:
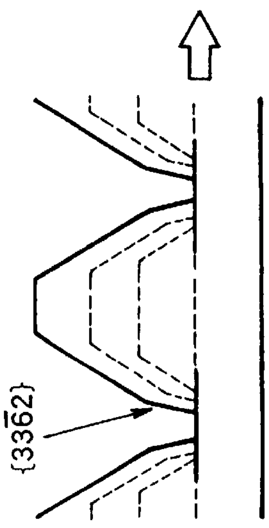
Figure 5D:
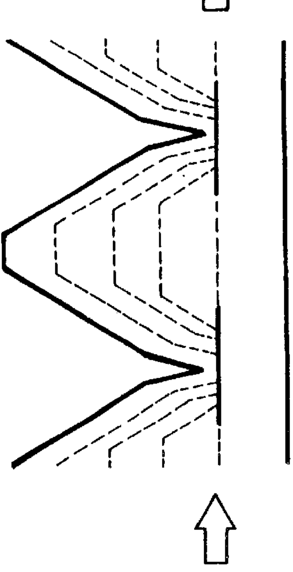
Figure 5E:
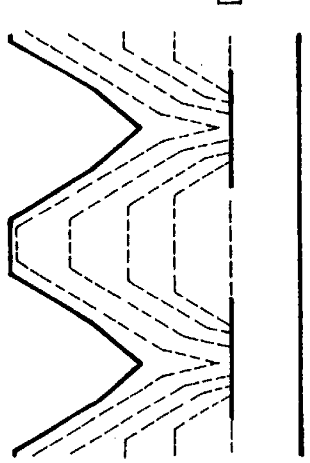
Figure 5F:
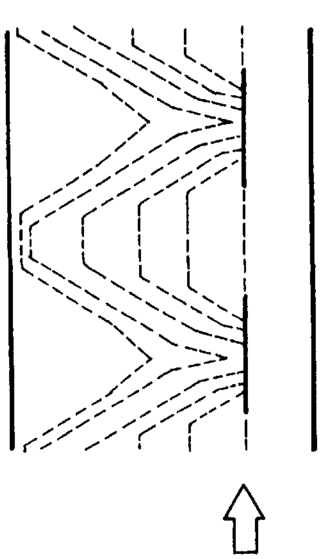

FIG. 4 is a set of views illustrating micrographs that will be used to explain results obtained in an experiment for investigating the effect of carrier gas mixing ratio (ratio of hydrogen gas and nitrogen gas partial pressures) on epitaxial lateral overgrowth of the second III–V Group compound semiconductor layer 5 and its crystallinity.

In the experiment, a III–V Group compound semiconductor 1 of the structure shown in FIG. 1 was formed by the HVPE method under conditions of:

Growth temperature: 1070° C., growth pressure: atmospheric pressure, growth period: 1~60 minutes, partial pressure of ammonia in starting material gas: 0.2 atm, partial pressure of hydrogen chloride in starting material gas: $8\times10^{-3}$ atm. A mixed carrier gas of nitrogen and hydrogen was used as the carrier gas and its effect was examined by conducting the experiment under ratios of hydrogen content to total amount of carrier gas ($H_2$/ ($H_2$+$N_2$); hydrogen gas partial pressure ratio) of 0, 0.5 and 0.9.

$SiO_2$ used as mask material was deposited on the ELO substrate by the RF sputtering method to a thickness of 80 nm and was formed with a <11–20> or <1–100> stripe pattern by photolithography. The mask/window width was 5 $\mu$m/5 $\mu$m.

The effect of carrier gas change on morphology at the initial growth stage was investigated in the following manner.

The growth period was set at 3 minutes and the mask/window width at 5 $\mu$m/5 $\mu$m. The horizontal axis in FIG. 4 is scaled for the partial pressure ratio of the hydrogen gas in the mixed carrier gas. A value of 0 indicates that growth was conducted with nitrogen gas only. In the case of the <11–20> stripes, {1–101} plane was formed irrespective of hydrogen gas content and growth was lateral. In the case of the <1–100> stripes, the c plane and {11–22} plane appeared when growth was conducted with nitrogen gas only, but when the carrier gas also included hydrogen, a plane lying at an angle of 78° to the c plane appeared in addition to the {11–22} plane. This plane appears more readily with increasing ratio of hydrogen carrier.

A plane lying at an angle of 78° to the c plane can, from its angle, be concluded to be a {33–62} facet. The {33–62} facet is a plane in which {11–20} plane type dangling bonds of two molecular layers and {11–22} plane type dangling bond of 1 molecular layer alternate periodically.

FIG. 5A to FIG. 5F show a set of diagrams showing how the ELO morphology changed when the second III–V Group compound semiconductor layer 5 was formed using a mixed carrier gas of hydrogen gas and nitrogen gas.

The morphology change with variation in the mask/window ratio was also investigated, as explained below.

Growth was conducted using a hydrogen gas mixing ratio (partial pressure ratio) of 0.5, <1–100> stripes, and growth period of 3 minutes. Overgrowth occurred at 3 $\mu$m/3 $\mu$m owing to the narrow mask width. The morphologies obtained using 5 $\mu$m/5 $\mu$m and 7 $\mu$m/3 $\mu$m stripe patterns of 10 $\mu$m period were compared. As the morphologies were found to be substantially the same, it was concluded that growth rate does not depend on mask/widow width.

The second III–V Group compound semiconductor layer 5 at the initial growth stage using a mixed carrier gas of hydrogen gas and nitrogen gas was observed with a scanning electron microscope.

The {33–62} plane appeared about 3 minutes after the start of growth, lateral growth proceeded while maintaining almost the same ratio between the {11–22} and {33–62} planes, coalescence on the mask started at about 5 minutes, and total overgrowth was observed at about 10 minutes.

Defect evaluation can be conducted using any of various know techniques. These include, for example, observation of mapping dark spots by cathode luminescence (CL), observation of dislocation image at crystal surface by atomic force microscope (AFM), evaluation of density of etch pits formed by molten alkali- or phosphoric acid-based etchant (known as etch pit density or EPD evaluation), evaluation of abnormal growth points (growth pits) arising during growth on a crystal surface of a material with a mismatched lattice like that of InGaN with respect to GaN, and observation of dislocation image by transmission electron microscope (TEM).

Figures 6, 7:
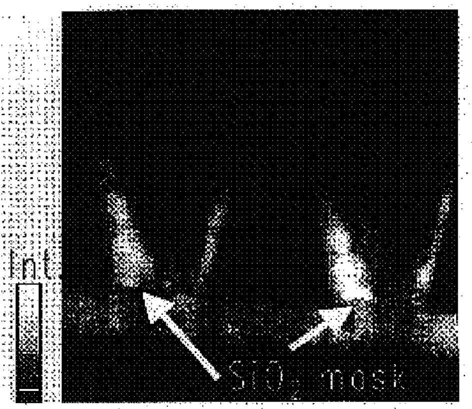
FIG. 6 is a micrograph showing the result obtained by cathode luminescence mapping when growth was conducted by the use of a mixed nitrogen-hydrogen carrier gas for 60 minutes.
FIG. 7 is a micrograph showing the result obtained by cathode luminescence mapping when growth was conducted by the use of a carrier gas composed of nitrogen gas only for 60 minutes.

FIG. 6 and FIG. 7 are micrographs showing the results obtained when growth was conducted for 60 minutes using the same <1–100> stripe pattern mentioned earlier. The result obtained by growth using a mixed nitrogen-hydrogen carrier gas is shown in FIG. 6 and the result obtained by growth using a carrier gas composed of nitrogen gas only is shown in FIG. 7. FIG. 6 and FIG. 7 are the images obtained by cathode luminescence mapping at wavelength of 360 nm and room temperature.

Figure 8:
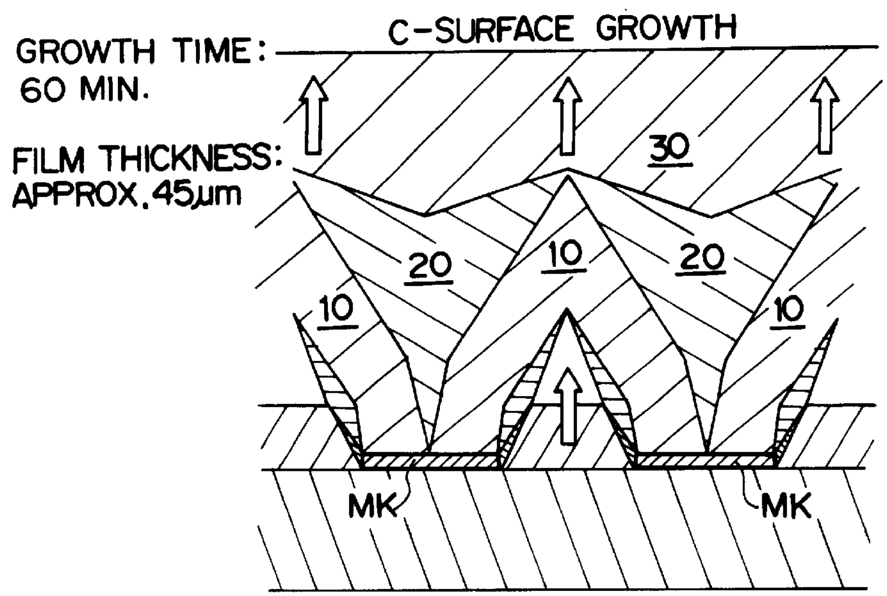
FIG. 8 is a diagram illustrating the image shown in FIG. 6 in order to describe the result shown in FIG. 6.
Figure 9:
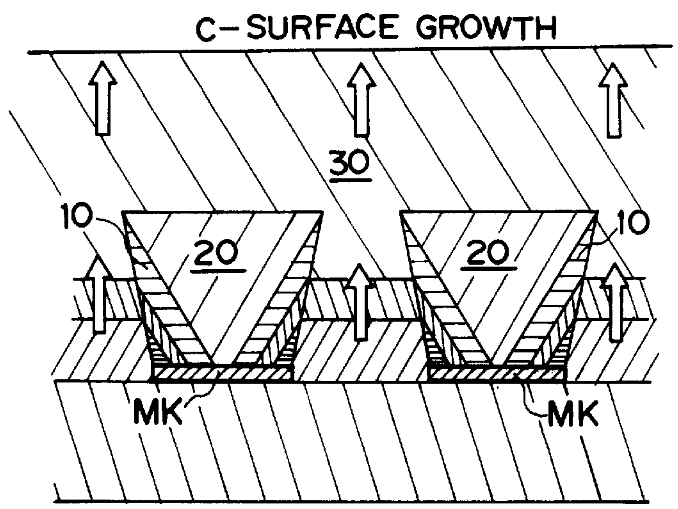
FIG. 9 is a diagram illustrating the image shown in FIG. 7 in order to describe the result shown in FIG. 7.
Figure 10:
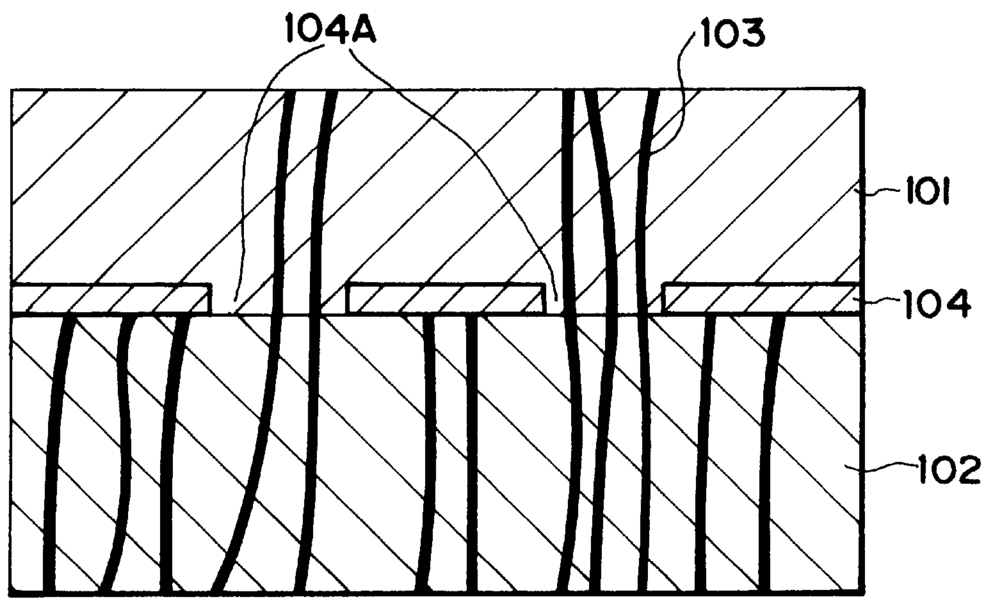
FIG. 10 is a diagram showing how threading dislocations are terminated by a mask pattern.
Figure 11:
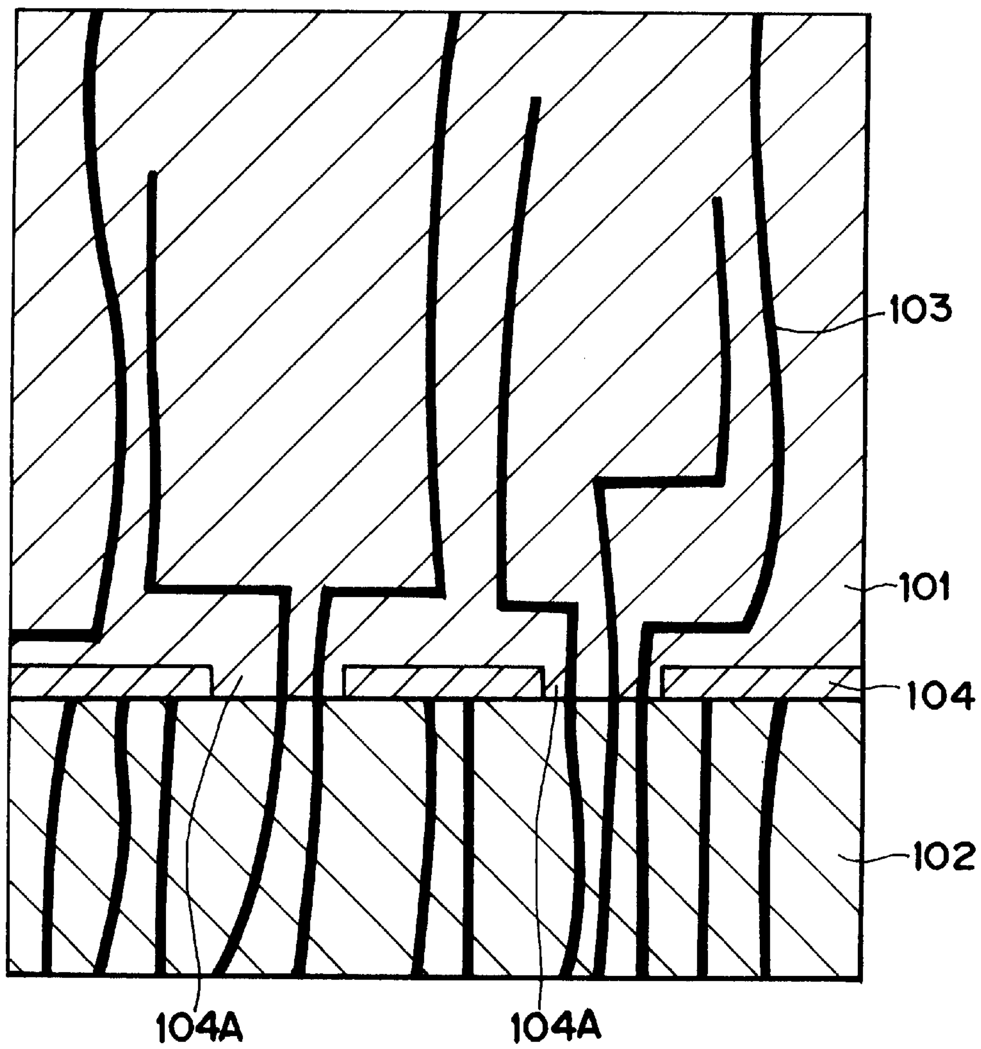
FIG. 11 is a diagram showing how the direction of threading dislocations is bent by facets.

FIG. 8 is a diagram illustrating the image shown in FIG. 6. FIG. 9 is a diagram illustrating the image shown in FIG. 7. In FIG. 8 and FIG. 9 the reference MK designates a $SiO_2$ mask and an HVPE growth layer is shown on the $SiO_2$ mask MK. The portions 10 are places where light emission was strong and correspond to portions where lateral growth by inclined facets was conducted. The portions 20 are places where light emission was weak and correspond to portions where growth by the c plane was conducted. The weak light emission portions 30 at the top are portions where c-plane growth was conducted after overgrowth in the lateral direction.

In view of reports that ELO experiences c-axis fluctuation during lateral growth above the mask, X-ray rocking curve (XRC) measurement was carried out with the X-ray angle of incidence parallel and normal to the stripe pattern direction defined as $\Phi=0°$ and $\Phi=90°$, respectively. It was found that the c axis fluctuates during lateral growth because, both when using a mixed gas and when using only nitrogen gas, the half width at half maximum (FWHM) of XRC at $\Phi=90°$ is large. From the fact that FWHM of XRC when using a mixed carrier gas was smaller than that when using only nitrogen gas it was confirmed that mixing hydrogen gas into the carrier gas improves crystallinity.

The effects of the mixed carrier gas including hydrogen gas on epitaxial lateral overgrowth (ELO) of GaN by the HVPE method were: that in the case of using <11–20> stripes, lateral growth was conducted by the {1–101} plane; that in the case of using <1–100> stripes, lateral growth was conducted by the {11–22} plane and {33–62} plane; that the ratio of growth by the {33–62} plane increased with increasing amount of hydrogen carrier; and that when the hydrogen carrier was used, overgrowth was conducted by the inclined facet with hardly any appearance of the c plane. It was found that the FWHM of XRC decreases relative to the case of conducting regrowth by nitrogen carrier only.

The present invention, by controlling the carrier gas partial pressure in the HVPE method, enables fabrication of crystal of reduced defect density over a broad area at a relatively high growth rate. In addition, the present invention enables fabrication of a light-emitting device enhanced in light-emitting characteristics and reliability. Owing to the reduction of defect density, moreover, a light-emitting device with thoroughly suppressed dark current can be fabricated. Fabrication of electronic devices with improved characteristics is possible thanks to the reduction of defects.

When the present invention is implemented, depending on the pattern fabrication conditions and regrowth conditions, depressions may occur in the surface of the first III–V Group compound semiconductor layer 3 after regrowth. In some cases, occurrence of such depressions can be avoided by forming at least surface portion of the first III–V Group compound semiconductor layer 3 of III–V Group compound semiconductor represented by the general formula $In_uGa_vAl_wN$ (where, $0 \leqq u \leqq 1$, $0 \leqq v \leqq 1$, $0 \leqq w \leqq 1$, $u+v+w=1$). An example would be where the AlN content of the crystal (the value of w in the general formula) is 1% or greater, preferably 5% or greater. The range of the thickness of the surface portion of the first III–V Group compound semiconductor layer 3 would, for example, be 0.3 nm or greater, preferably 1 nm or greater.

The material used for the pattern in the present invention is preferably one with a certain degree of durability against the process of the compound semiconductor regrowth. This is because the desired regrowth is difficult to conduct with good reproducibility if, under the regrowth atmosphere and temperature, the material used to fabricate the pattern melts or disappears owing to evaporation or the like before the start of the regrowth. Materials that can be used under the regrowth conditions include $SiO_2$ (silicon dioxide), W, Re, Mo, Cr, Co, Si, Au, Zr, Ta, Ti, Nb, Ni, Pt, V, Hf, Pd and other simple substances, BN (boron nitride), and nitrides of W, Ti, Zr, Hf, V, Nb, Ta, Cr, Mo, Re, Fe, Si and the like.

In the present invention, the pattern can be composed of two or more deposited layers of different materials.

Any of various conventional pattern configurations can be used in the present invention. Specific examples include the line/space pattern composed of a series of stripes of constant width separated by spaces of constant width, and configurations that partially expose the base material through circular or polygonal openings. Selection can be made from among such pattern configurations based on the regrowth conditions, pattern material properties and the like.

In the case of the line/space pattern, the width of the pattern portion is preferably not less than 0.05 $\mu$m and not greater than 20 $\mu$m. When the pattern portion width is less than 0.05 $\mu$m, the defect density reducing effect of the present invention is not markedly expressed. When it is greater than 20 $\mu$m, the time required to overgrow the pattern becomes impractically long. For the same reasons, a pattern having circular or polygonal openings should preferably have a separation between openings of not less than 0.05 $\mu$m and not greater than 20 $\mu$m.

In the case of the line/space pattern, the width of the space portions (openings: portions where the base material is exposed) is preferably not less than 0.01 $\mu$m and not greater than 20 $\mu$m. Setting the width of the space portions at less than 0.01 $\mu$m is undesirable because fabrication of accurate shapes is practically difficult with currently available semiconductor processes. When the width of the spaces portions is greater than 20 $\mu$m, the defect density reducing effect of the present invention is not markedly expressed. For the same reasons, in a pattern having circular or polygonal openings, the size of the openings should preferably be not less than 0.01 $\mu$m and not greater than 20 $\mu$m.

The pattern can be fabricated by such conventionally known methods as the vapor deposition method, sputtering method, chemical vapor deposition (CVD) method and plating method. The fabrication can be conducted by first forming a thin film of a simple substance and then chemically reacting the simple substance to afford the desired compound material. For instance, a tungsten thin film can be formed first and then heat-treated in an atmosphere containing ammonia to obtain a tungsten nitride film. The pattern thickness can be decided with consideration to durability and productivity. The thickness of a tungsten or $SiO_2$ pattern is preferable not less than 2 nm and not greater than 5 $\mu$m.

Specific values of other growth conditions include the following. Growth temperature, while depending on the physical properties of the compound semiconductor to be grown, is preferably not less than 600° C. and not greater than 1200° C., provided that the compound semiconductor does not include In as a constituent element. When the regrowth temperature is below 600° C. or higher than 1200° C. good quality crystal cannot be easily obtained by the regrowth. Further, since In lowers thermal stability, the regrowth temperature should preferably be not less than 600° C. and not greater than 900° C. in the case of a compound semiconductor that includes In as a constituent element.

In the present invention, the pressure during regrowth can, for example, be greater than 100 Pa. When the pressure during regrowth is less than 100 Pa, good quality crystal is hard to obtain. The pressure is preferably 500 Pa or greater, more preferably 1000 Pa or greater. Although crystallinity may improve with increasing growth temperature, MOVPE and HVPE equipment generally used for crystal growth cannot be used industrially a very high growth pressures. The growth pressure during regrowth is therefore preferably no greater than 10 atmospheres.

The method of decreasing defects according to the present invention can be used in combination with other defect reduction methods. Specific examples of defect reduction methods with which the method of the present invention can be combined include the method using a low-temperature grown intermediate layer (Jpn. J. Appl. Phys., 1999, vol. 38, p. L1515), the method of forming spatial gaps between the base layer and the regrown layer by regrowth (sometimes called the air bridge method; J. Cryst. Growth. 2000, vol. 221, p. 338), the method of regrowth on a partially etched crystal surface (sometimes called the grooved stripe method; J. Cryst. Growth., 2000, vol. 221, p. 345), the method of etching the crystal surface and conducting crystal growth from the etched side surface (sometimes called the pendeo-epitaxial method; MRS Internet Journal, Nitride Semicond. Res., 1999, vol. 4S1, paper no. G3. 38), the method of partially etching the crystal surface and thereafter flattening the high-temperature annealed crystal surface (sometimes called the mass transport method; MRS Internet Journal, Nitride Semicond. Res., 2000, vol. 5S1, paper no. W2. 8), and the method of conducting regrowth after formation of minute bits of foreign matter on the crystal surface (sometimes called the antisurfactant method; Jpn. J. Appl. Phys., 2000, vol. 39, p. L831). Among these, the method using a low-temperature grown intermediate layer, the grooved stripe method, the mass transport method and the antisurfactant method can be used to good advantage.

The present invention or the present invention in combination with other methods enables attainment of a compound semiconductor with markedly reduced crystal defects to be attained at a relatively thin thickness. The present invention therefore enables reduction of substrate warp and is also highly effective for improving processing property in device fabrication processing.

In accordance with the present invention, a gallium nitride-based compound semiconductor overgrowth structure having a flat surface obtained by a regrowth method using the hydride vapor phase growth method is formed on a base crystal containing gallium nitride-based compound semiconductor and formed with a mask pattern, by a process that utilizes the regrowth to once annihilate a plane parallel to the base crystal by a facet group including at least the {33–62} facet, thereby enabling fabrication of high-quality III–V Group compound semiconductor having a reduced number of threading dislocations in a relatively short time. Since the formation of the required facets can be achieved by controlling the mixing ratio of the mixed carrier gas (the partial pressure ratio), the process is simple and can be implemented at low cost.

What is claimed is:

1. A method for fabricating a Ill–V Group compound semiconductor, the method comprising:

a step of preparing a base crystal containing gallium nitride-based compound semiconductor formed with a pattern mask; and a step of fabricating an overgrowth structure of gallium nitride-based compound semiconductor having a flat surface on said base crystal by utilizing a regrowth method; the fabricating step including a step of annihilating a plane parallel to the base crystal by a facet group including at least {33–62} facet, wherein the regrowth method is a hydride vapor phase epitaxy method, a carrier gas for conducting the regrowth is a mixed carrier gas of hydrogen gas and nitrogen gas, and the annihilating step is controlled by formation of the facet group through controlling a mixing ratio of the mixed carrier gas.

2. A method for fabricating a III–V Group compound semiconductor as claimed in claim 1, wherein the mask pattern is a stripe pattern parallel to the <1–100> direction.

3. A method for fabricating a III–V Group compound semiconductor as claimed in claim 1 or 2, wherein AlN content of the base crystal is note less than 1%.

* * * * *